United States Patent [19]
Lo et al.

[11] 4,001,795
[45] Jan. 4, 1977

[54] MAGNETO-INDUCTIVE READOUT OF CROSS-TIE WALL MEMORY SYSTEM USING HARD AXIS DRIVE FIELD AND NOISE CANCELLING SENSE LINE

[75] Inventors: David S. Lo, Burnsville; Maynard C. Paul, Bloomington, both of Minn.

[73] Assignee: Sperry Rand Corporation, New York, N.Y.

[22] Filed: Aug. 28, 1975

[21] Appl. No.: 608,817

[52] U.S. Cl. .................. 340/174 TF; 340/174 KA
[51] Int. Cl.² ..................................... G11C 11/02
[58] Field of Search ... 340/174 R, 174 TF, 174 KA, 340/174 LA, 174 HP, 174 SR, 174 DC

[56] References Cited
UNITED STATES PATENTS 3,703,712   11/1972   Bobeck et al. ............... 340/174 TF Primary Examiner—Marshall M. Curtis
Attorney, Agent, or Firm—Kenneth T. Grace; Thomas J. Nikolai; Marshall M. Truex

[57] ABSTRACT

A method of and a configuration for reading out the information that is stored in a cross-tie wall memory system is disclosed. The apparatus utilizes: a cross-tie, Bloch-line pair transfer system for bit-serially moving a bit-defining-Bloch-line along the cross-tie wall into a memory segment; a noise-cancelling figure-8 sense line that straddles the cross-tie wall; a hard axis drive field $H_T$ that passes, if in existence, a bit-defining-Bloch-line out of the memory segment into one of the loops of the sense line and thus inducing in the sense line loop an output signal that is indicative of the passing, or not, of the Bloch-line into the sense line loop.

4 Claims, 6 Drawing Figures

MAGNETO-INDUCTIVE READOUT OF CROSS-TIE WALL MEMORY SYSTEM USING HARD AXIS DRIVE FIELD AND NOISE CANCELLING SENSE LINE

BACKGROUND OF THE INVENTION

The propagation of inverted Néel wall sections instead of magnetic bubbles in a serial access memory system was first proposed by L. J. Schwee in the publication "Proposal on Cross-Tie Wall and Bloch Line Propagation In Thin Magnetic Films," IEEE Transactions on Magnetics, MAG 8, No. 3, pp. 405–407, September, 1972. Such a memory system utilizes a ferromagnetic film of 81% Ni–19% Fe of approximately 300 angstroms (A) thick in which cross-tie walls can be changed to Néel walls and Néel walls can be changed to cross-tie walls by applying appropriate fields. Associated with the cross-tie wall is a section of inverted Néel wall that is bounded by a cross-tie on one end and a Bloch-line on the other end.

In such a cross-tie wall memory system, information is entered at one end of the serial access memory system by the generation of an inverted Néel wall section that is representative of a stored binary 1 and a non-inverted Néel wall section that is representative of a stored binary 0, and is moved or propagated along the cross-tie wall by the successive generation (and then the annihilation) of the inverted Néel wall sections at successive memory cells along the cross-tie wall. In the D. S. Lo, et al., patent application Ser. No. 495,971, filed Aug. 9, 1974, now U.S. Pat. No. 3,906,466 there is disclosed a propagation circuit for the transfer of inverted Néel wall sections at successive memory cells along the cross-tie wall. In the L. J. Schwee U.S. Pat. No. 3,868,660 and in a Naval Ordnance Laboratory Report NOLTR 73–185, L. J. Schwee, et al., there have been published some recent results of the further development of cross-tie wall memory systems and of detectors for the readout of the binary information that is stored therein.

SUMMARY OF THE INVENTION

The present invention is directed toward a novel method of and a configuration for reading out the information that is stored in a cross-tie wall memory system. The invention includes: aligning a noise-cancelling sense line loop straddled about the cross-tie wall; coupling a hard axis drive field $H_T$ to a bit of binary data that is stored in a memory segment of the cross-tie wall memory system; driving the Bloch-line (if in existence representing the storage of a binary 1 bit) along said cross-tie wall, out of said memory segment and into said sense line loop; and then, sensing the passage of said bit-defining-Bloch-line out of said memory segment and into said sense line loop by a sense amplifier coupled to said sense line loop.

DESCRIPTION OF THE PREFERRED EMBODIMENT

Figure 1:
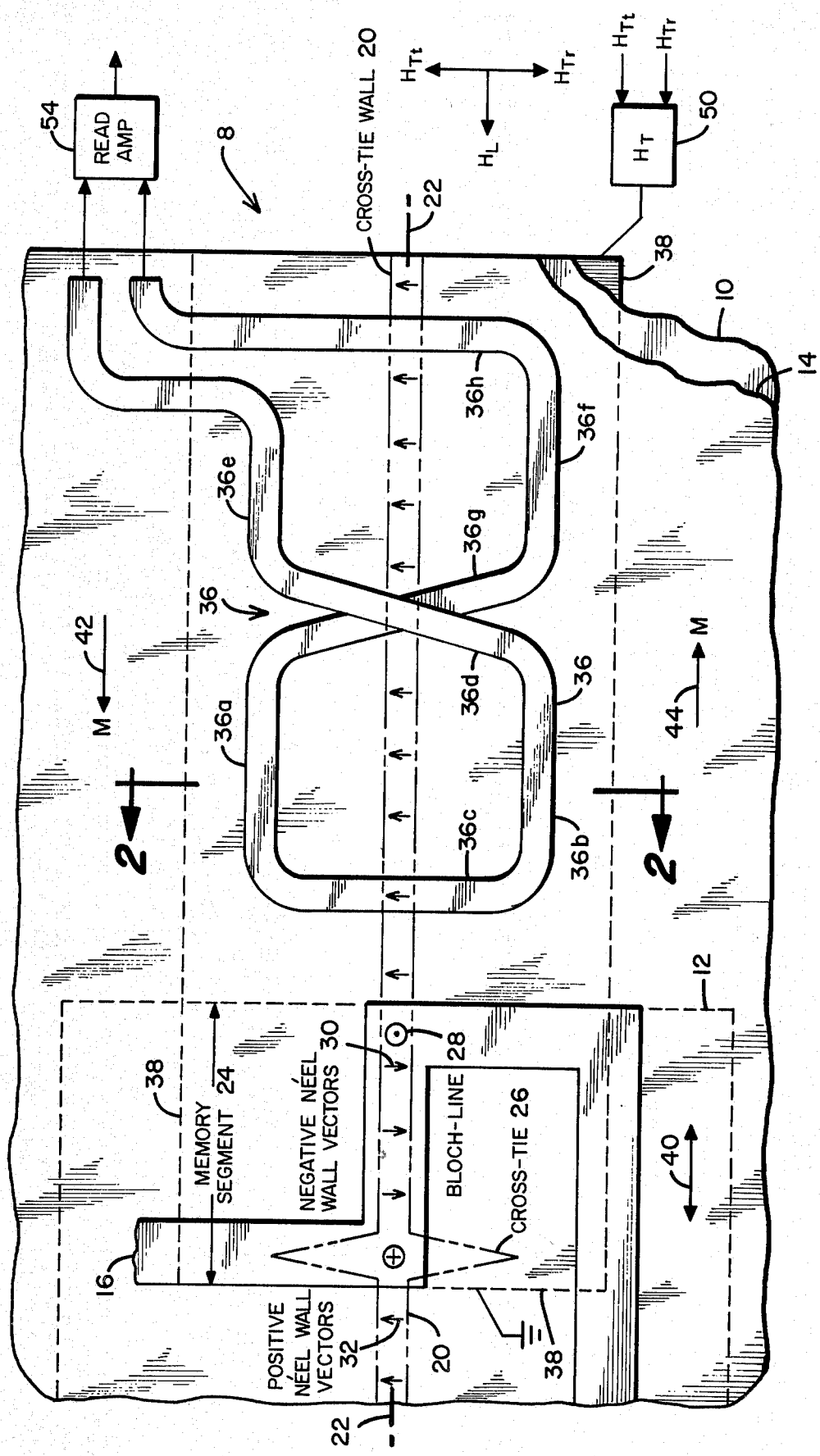
FIG. 1 is a schematic illustration of a portion of a cross-tie wall memory system illustrating, in detail, the magneto-inductive detector of the present invention.

FIG. 1 is an illustration of a portion of a prior art cross-tie memory system into which the magneto-inductive detector 8 of the present invention is incorporated. This prior art cross-tie memory system may be similar to that of the hereinabove referenced D. S. Lo et al., U.S. Pat. No. 3,906,466 and includes a non-magnetizable, e.g., glass, substrate member 10 having a copper microstrip 12 affixed to its bottom side and a thin ferromagnetic layer 14 affixed to its top side. Affixed to the top side of layer 14 and superposed the microstrip 12 is a copper drive line 16 which is affixed to and superposed to magnetic layer 14 but separated therefrom by an insulative, e.g., SiO or Mylar, member 18 — see FIG. 2. Drive line 16 consists of a plurality of serially-intercoupled portions, each of which defines a memory cell, that are overlaid and are uniformly spaced along a cross-tie wall 20 oriented along a longitudinal axis 22.

In accordance with the hereinabove referenced D. S. Lo et al., U.S. Pat. No. 3,906,466, there is stored in the memory segment 24 an inverted Néel wall section, bounded by a cross-tie 26 on one end and a Bloch-line 28 on the other end, representative of the storage of a binary 1 in memory segment 24. Such inverted Néel wall section is represented by the negative Néel wall vectors 30 pointed in a downwardly direction while the remaining portion, i.e., the non-inverted Néel wall section, of the cross-tie wall is represented by the positive Néel wall vectors 32 pointed in an upwardly direction. If such representative memory segment 24 were to be redrawn for the purpose of illustrating the storage of a binary 0, the cross-tie 26, Bloch-line 28 pair illustrated in the memory segment 24 would be deleted with the cross-tie wall 20 being represented by a continuation of the positive Néel wall vectors 32 throughout cross-tie wall 20 including memory segment 24.

Magneto-inductive sensing or readout of a magnetizable memory system is one of the most fundamental techniques for detecting output signals in a computer memory system. For the cross-tie memory system of FIGS. 1, 2, a figure-8 sense line loop 36 is used to detect the induced output signal that is generated by the motion of Bloch-line 28 when it moves into sense line loop 36. This design eliminates the stray field problem and the sense line loop registration problem, and allows highly sensitive AC detection. Sense line 36 of FIG. 1 is designed for sensing any magnetic flux that is perpendicular to the film plane of layer 14, such as the perpendicular field of the Bloch-line 28. Any externally applied fields, earth's field, and other stray fields generate a voltage in both the first and second loops of the figure-8 sense line 36 with opposite polarities and thus produce no net effect in the output signal level at read amplifier 54. This is very important because of the low output signal level and of any inherent undesirable magnetic fields. Furthermore, when Bloch-line 28 is driven along the cross-tie wall by an externally applied field, e.g., hard axis drive field $H_T$, the magnetic domains on both sides of the cross-tie wall are also being rotated. Flux changes due to magnetic domain rotation on opposite sides of the cross-tie wall generate voltage, but with opposite polarity, within sense line 36, and, accordingly, produce no net effect.

The physical size of the cross-tie, Bloch-line pair and of the sense line 36 is very small, both approximately 1 mil. Accordingly, it is difficult to position sense line 36 exactly symmetrical with respect to the cross-tie, Bloch-line pair on the cross-tie wall. However, due to the symmetry of sense line 36, any deviation from the exact symmetrical position due to skew or translation produces no net effect. This noise cancelling feature is highly desirable for any engineering design, especially in the high data-density cross-tie wall memory.

Figure 2:
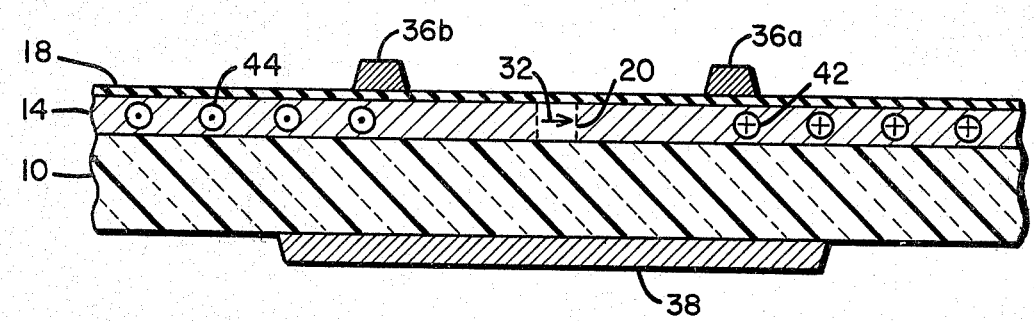
FIG. 2 is an illustration of a cross-sectional view of the detector of FIG. 1 taken along line 2—2 thereof.

With particular reference to FIG. 2 there is presented a cross-sectional view of detector 8 of FIG. 1 taken along line 2—2 thereof for the purpose of illustrating the stacked, superposed elements of FIG. 1 and the magnetic vector representations thereof. FIGS. 1, 2 illustrate that detector 8 illustrated therein includes a non-magnetizable, e.g., glass, substrate member 10 having a thin ferromagnetic layer 14 affixed to its top side. Affixed to the top side of layer 14 but separated therefrom by an insulative, e.g., SiO or Mylar, member 18, and straddling cross-tie wall 20 is a noise-cancelling, figure-8 copper sense line 36 consisting of parallel pairs of members 36a, 36b and 36c, 36d that form a first sense line loop and 36e, 36f and 37g, 36h that form a second sense line loop. Affixed to the bottom side of substrate member 10 and straddling cross-tie wall 20 is the copper drive line 38 which is utilized by detector 8 to couple to cross-tie wall 20 a hard axis drive field $H_T$. Note that layer 14 has an easy axis 40 with the magnetization M thereof above the cross-tie wall 20 being aligned in a leftward direction denoted by vector 42 and below the cross-tie wall 20 being aligned in a rightward directin denoted by vector 44.

Figure 3:
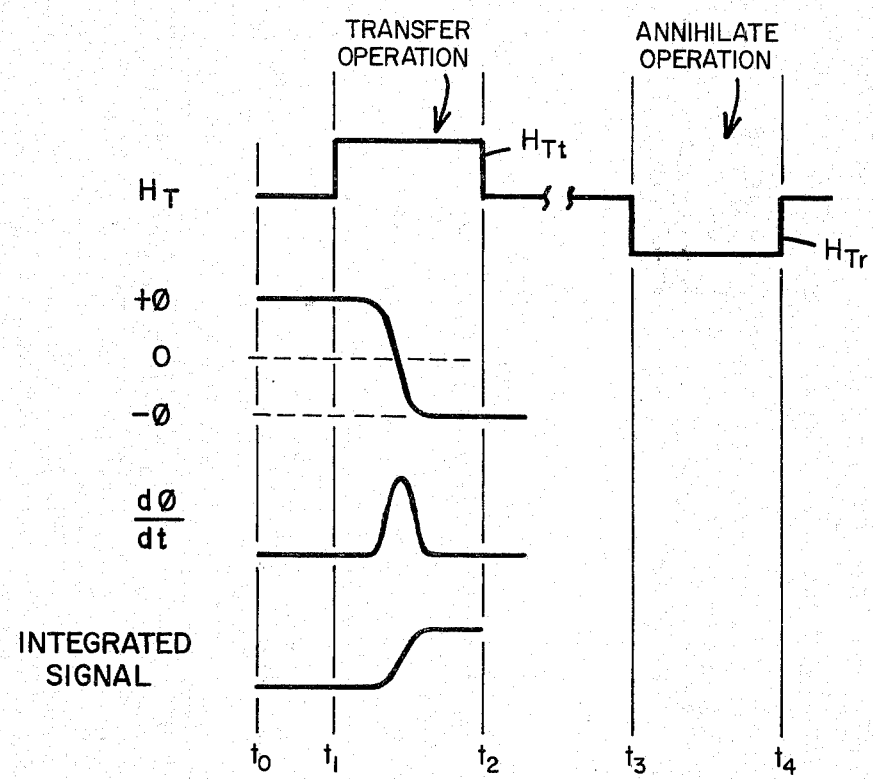
FIG. 3 is an illustration of the waveforms of the timing diagram associated with the detector of FIG. 1 for a readout operation utilizing a single DC hard axis drive field $H_T$.
Figure 4:
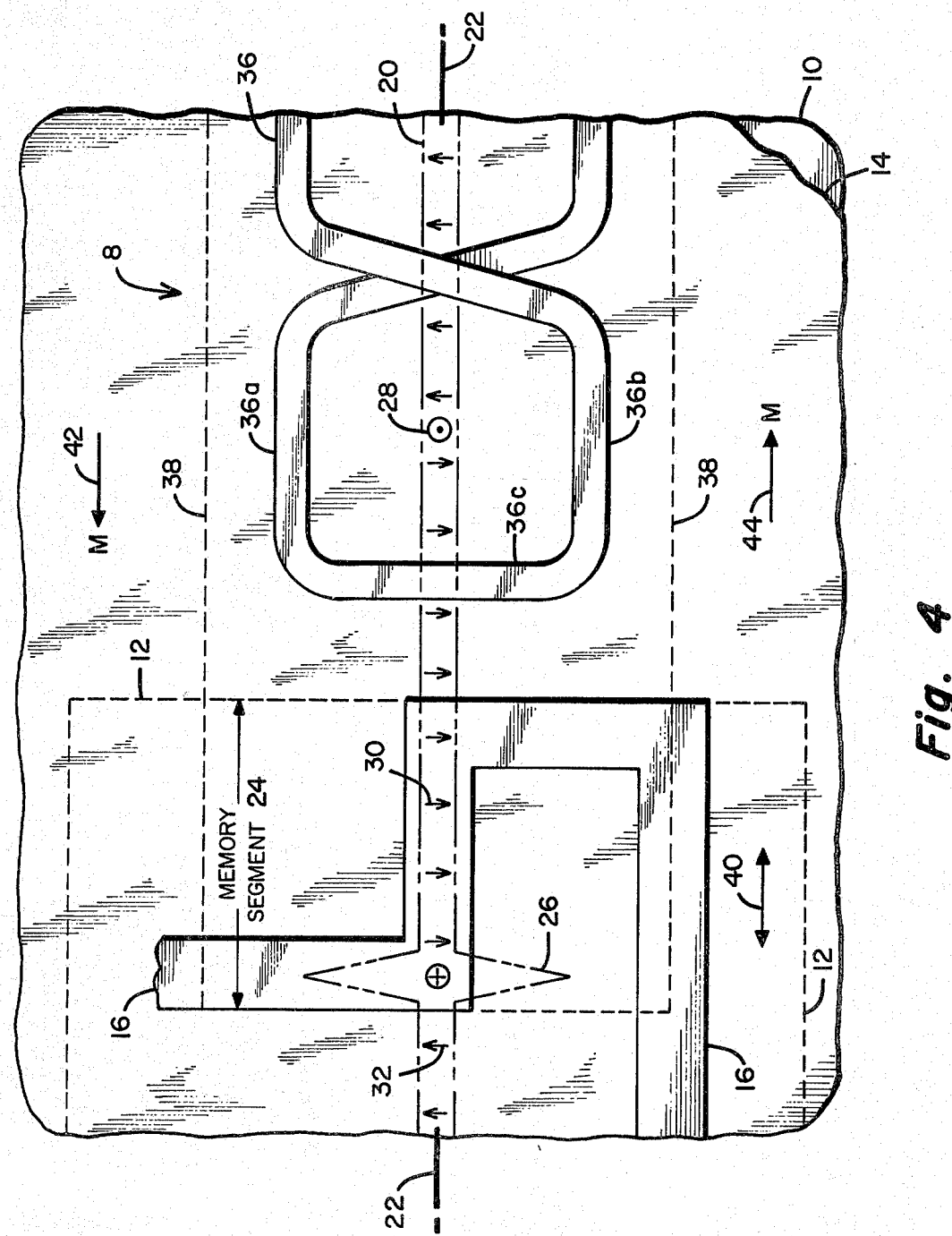
FIG. 4 is a schematic illustration of a portion of the cross-tie wall memory system of FIG. 1 illustrating the Neel wall vector orientation after the passage of a bit-defining-Bloch-line out of the memory segment and into the sense line loop.

With particular refernce to FIG. 3 there are illustrated the waveforms of a first timing diagram associated with the operation of detector 8 of FIG. 1. In the transfer operation of detector 8 of FIG. 1, hard axis drive field $H_T$ driver 50, as at time $t_1 - t_2$, couples a single, DC current drive signal of the proper waveform to hard axis drive line 38 for the purpose of coupling to cross-tie wall 20, from the lefthand edge of memory segment 24 to the righthand edge of sense line 36, a downwardly directed hard axis drive field $H_{Tt}$. Assuming an inverted Néel wall section indicated of a stored a binary 1 to have been stored in memory segment 24, as denoted by the downwardly directed negative Néel wall vectors 30, the downwardly directed hard axis drive field $H_{Tt}$ would have an additive effect on the negative Néel wall vectors 30 within the inverted Néel wall section in memory segment 24. This would cause Bloch-line 28 to be moved in a rightward direction along cross-tie wall 20 and into the first sense line loop formed by segments 36a, 36b, 36c and 36d. This transfer of Bloch-line 28 from memory segment 24 along cross-tie wall 20 and into the first sense line loop formed of sense line segments 36a, 36b, 36c and 36d is illustrated in FIG. 4. This movement of Bloch-line 28 would cause the Néel wall vectors, within cross-tie wall 20 from the lefthand edge of memory 24 defined by cross-tie 26 to within the first sense line loop defined by the new position of Bloch-line 38, to be aligned as downwardly directed negative Néel wall vectors 30. This movement of Bloch-line 28 from the left to the right under sense line segment 36c effects the flux change $+\phi$ to $-\phi$ inducing in sense line 36 the voltage $d\phi/dt$.

Sense amplifier 54 senses this induced voltage and provides as an output signal therefrom the illustrated integrated output signal.

Subsequent to the readout operation, as at time $t_3 - t_4$, the annihilate operation is performed. This annihilate operation is performed unconditionally irrespective of the readout of a stored 1 or of a stored 0 for establishing the Néel wall vectors in the cross-tie wall 20 within the first sense line loop to be reestablished in their original upwardly directed positive Néel wall vector 32 orientation such as illustrated in FIG. 1. This annihilate operation consists of restoring Bloch-line 28 back into its original position within memory segment 24 as illustrated in FIG. 1.

Figure 5:
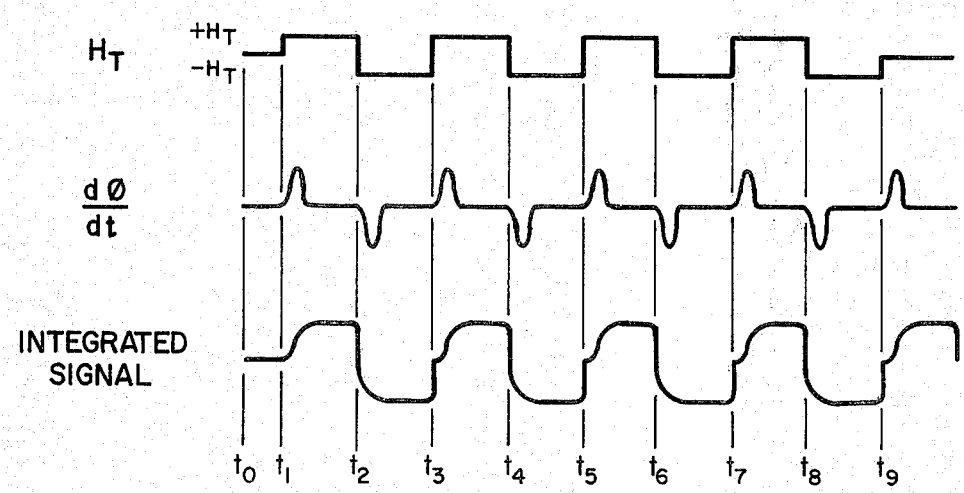
FIG. 5 is an illustration of the waveforms of the timing diagram associated with the detector of FIG. 1 when using a plurality of AC hard axis drive fields $H_T$.

With particular reference to FIG. 5 there are illustrated the waveforms of a second timing diagram associated with the operation of detector 8 of FIG. 1. In the method of operation of detector 8 as illustrated in FIG. 5, hard axis drive field $H_T$ driver 50 couples a bi-polar, AC current drive signal of the proper waveform to hard axis drive line 38 for the purpose of coupling to cross-tie wall 20, from the lefthand edge of memory segment 24 to the righthand edge of sense line 36, an upwardly directed hard axis drive field $+H_T$ and downwardly directed hard axis drive field $-H_T$. This operation may be considered to be somewhat similar to that illustrated in FIG. 4, but in which the transfer, annihilate operations follow each other consecutively such that the Bloch-line 28 is continuously moved back and forth between its original position in memory segment 24, as in FIG. 1, and within the first sense line loop, as illustrated in FIG. 4. Accordingly, the use of the single DC hard axis drive field $H_T$ pulse of FIG. 3 provides a much faster readout technique, while the use of the multiple AC hard axis drive field $\pm H_T$ produce an AC output signal that may be detected by a low-noise, tuned read amplifier. This bi-polar, AC sensing method provides, in sense line 36, the induced voltage $d\phi/dt$ which via sense amplifier 54 provides as an output therefrom the illustrated integrated output signal. In both modes of the sensing operation, as illustrated in FIG. 3 and FIG. 5, the passage of Bloch-line 28 under the sense line segment 36c induces in sense line 36 an output signal which is indicative of the informational state of memory segment 24.

Figure 6:
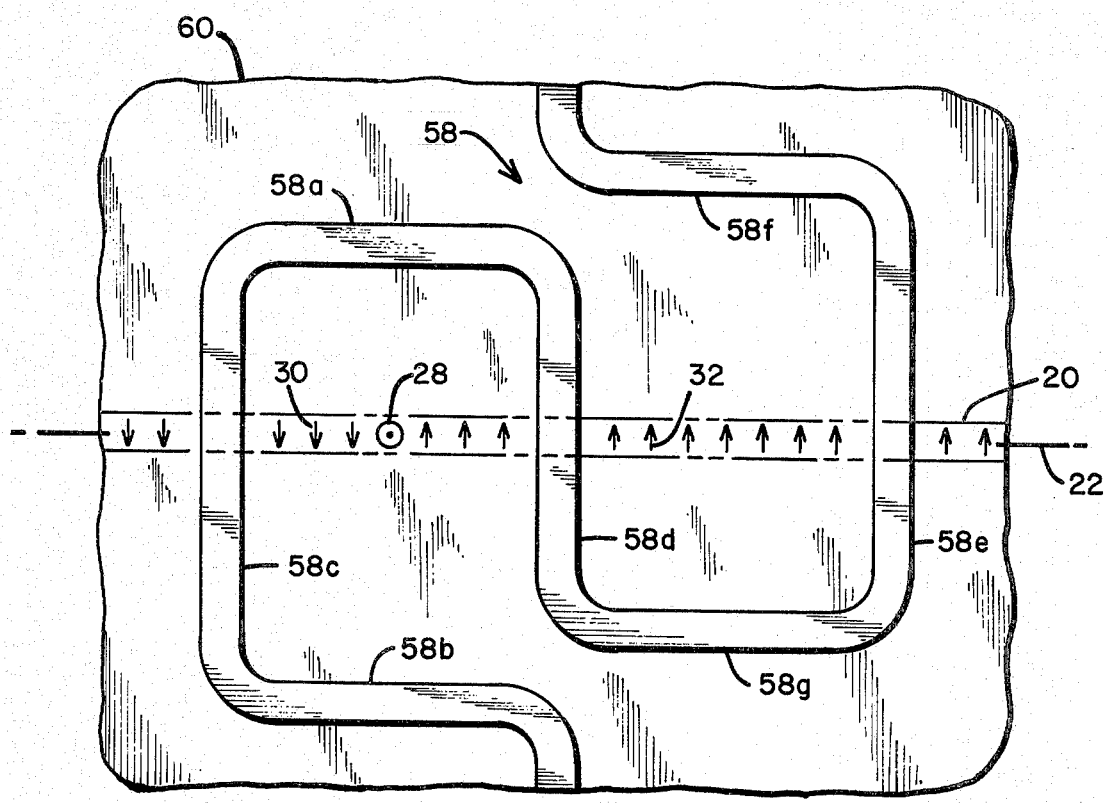
FIG. 6 is a schematic representation of another embodiment of the magneto-inductive detector of the present invention.

With particular reference to FIG. 6 there is illustrated a modification of the figure-8 design shown in FIG. 1. In FIG. 6 there is illustrated the copper sense line 58 consisting of parallel pairs of members 58a, 58b and 58c, 58d that form a first sense line loop and 58f, 58g and 58d, 58e that form a second sense line loop. The fabrication of this modified embodiment is simpler than that of FIG. 1, requiring only one film deposition cycle and one piece of photo-artwork for the photolithography of sense line 58. Also, there is no need for an insulating layer at a cross-over as is required in the area of elements 36d, 36g of FIG. 1. That is, the cross-over geometry of the figure-8 design requires an insulator in the center to prevent shorting, whereas the modified geometry of FIG. 6 (more of a figure-S) eliminates the cross-over so that no insulative layer is required, and, accordingly, the sense line 58 can consist of one continuous conductive element. The figure-8 design of FIG. 1 must be deposited in two parts of steps requiring careful alignment and a two-step deposition and etch cycle, while the insulative layer separating the first and second loops at the cross-over must be carefully placed by masked deposition or etching.

The noise cancellation properties of the modified design of FIG. 6 are similar to those of the design of FIG. 1 because of the symmetry of the structure. However, a slight loss of noise cancellation effectiveness occurs, due to the absence of the cross-over, when the cross-tie wall is displaced with respect to the long axis of sense line 58. In this respect the figure-8 design of FIG. 1 is less position-sensitive than is the figure-S design of FIG. 6.

What is claimed is:

1. In a cross-tie wall memory system in which bits of binary data are stored as inverted Néel wall sections, which inverted Néel wall sections are bounded by a cross-tie on one end and by a Bloch-line on the other end, in a cross-tie wall in a magnetizable layer having an easy axis and in which said binary data are serially propagated along said cross-tie wall by the interacting fields provided by associated drive lines, which drive lines have memory segments that are associated with associated memory cells in said magnetizable layer in which associated ones of said bits of binary data are stored as inverted Néel wall sections, a method of magneto-inductively reading out said bit-defining-Bloch-lines that are representative of stored binary data comprising:

aligning a noise cancelling sense line loop straddled about said cross-tie wall;
   coupling a sense amplifier to said sense line loop;
   coupling a hard axis drive field $H_T$ to a bit-defining-Bloch-line that is stored in said memory segment;
   driving said bit-defining-Bloch-line along said cross-tie wall, out of said memory segment and into said sense line loop;
   sensing the passage of said bit-defining-Bloch-line out of said memory segment and into said sense line loop by said sense amplifier.

2. In a cross-tie wall memory system in which bits of binary data are stored as inverted Néel wall sections, which inverted Néel wall sections are bounded by a cross-tie on one end and by a Bloch-line on the other end, in a cross-tie wall in a magnetizable layer having an easy axis and in which said binary data are serially propagated along said cross-tie wall by the interacting fields provided by associated drive lines, which drive lines have memory segments that are associated with associated memory cells in said magnetizable layer in which associated ones of said bits of binary data are stored as inverted Néel wall sections, a magneto-inductive detector for reading out said bit-defining-Bloch-lines that are representative of stored binary data comprising:

a noise cancelling sense line loop straddled about said cross-tie wall;
   a sense amplifier coupled to said sense line loop;
   an $H_T$ driver coupling a hard axis drive field $H_T$ to a bit-defining-Bloch-line that is stored in said memory segment for driving said bit-defining-Bloch-line around said cross-tie wall, out of said memory segment and into said sense line loop;
   said sense amplifier sensing the passage of said bit-defining-Bloch-line out of said memory segment and into said sense line loop as indicating the storage of said bit-defining-Bloch-line in said memory segment.

3. In a cross-tie wall memory system in which bits of binary data are stored as inverted Néel wall sections, which inverted Néel wall sections are bounded by a cross-tie on one end and by a Bloch-line on the other end, in a cross-tie wall in a magnetizable layer having an easy axis and in which said binary data are propagated along said cross-tie wall, by interacting fields, into memory segments that are associated with associated memory cells in said magnetizable layer in which associated ones of said bits of binary data are stored as inverted Néel wall sections, a method of magneto-inductively reading out said bit-defining-Bloch-lines that are representative of stored binary data comprising:

aligning a figure-8 sense line having first and second sense line loops straddled substantially symmetrically along said cross-tie wall;
   coupling a sense amplifier to said sense line;
   coupling a hard axis drive field $H_T$ to a bit-defining-Bloch-line that is stored in one of said memory segments;
   driving said bit-defining-Bloch-line along said cross-tie wall, out of said one memory segment and into a first sense line loop of said sense line;
   sensing the passage of said bit-defining-Bloch-line out of said one memory segment and into said first sense line loop by said sense amplifier.

4. In a cross-tie wall memory system in which bits of binary data are stored as inverted Néel wall sections, which inverted Néel wall sections are bounded by a cross-tie on one end and by a Bloch-line on the other end, in a cross-tie wall in a magnetizable layer having an easy axis and in which said binary data are propagated along said cross-tie wall, by interacting fields into memory segments that are associated with associated memory cells in said magnetizable layer in which associated ones of said bits of binary data are stored as inverted Néel wall sections, a magneto-inductive detector for reading out said bit-defining-Bloch-lines that are representative of stored binary data comprising:

a figure-8 sense line having first and second sense line loops straddled substantially symmetrically along said cross-tie wall;
   a sense amplifier coupled to said sense line;
   an $H_T$ driver coupling a hard axis drive field $H_T$ to a bit-defining-Bloch-line that is stored in one of said memory segments for driving said bit-defining-Bloch-line along said cross-tie wall, out of said one memory segment and into said first sense line loop;
   said sense amplifier sensing the passage of said bit-defining-Bloch-line out of said one memory segment and into said first sense line loop as indicating the storage of said bit-defining-Bloch-line in said one memory segment.

* * * * *